(12) United States Patent
Carroll et al.

(10) Patent No.: US 6,940,151 B2
(45) Date of Patent: Sep. 6, 2005

(54) SILICON-RICH LOW THERMAL BUDGET SILICON NITRIDE FOR INTEGRATED CIRCUITS

(75) Inventors: Michael Scott Carroll, Orlando, FL (US); Yi Ma, Santa Clara, CA (US); Minesh Amrat Patel, Orlando, FL (US); Peyman Sana, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/261,463

(22) Filed: Sep. 30, 2002

(65) Prior Publication Data

US 2004/0061179 A1 Apr. 1, 2004

(51) Int. Cl.[7] .............................. H01L 31/0392
(52) U.S. Cl. ................. 257/649; 257/636; 257/630; 257/640
(58) Field of Search ................. 257/328, 335, 257/370, 378, 408, 401, 640, 649, E21.038, 630, 636

(56) References Cited

U.S. PATENT DOCUMENTS

| | | | | |
|---|---|---|---|---|
| 4,962,065 A | * | 10/1990 | Brown et al. | 438/792 |
| 5,107,323 A | * | 4/1992 | Knolle et al. | 257/636 |
| 6,156,616 A | * | 12/2000 | Gris | 438/309 |
| 6,284,583 B1 | | 9/2001 | Saida et al. | |
| 2002/0119648 A1 | * | 8/2002 | Inoue et al. | 438/595 |

FOREIGN PATENT DOCUMENTS

| | | |
|---|---|---|
| EP | 0 928 015 A3 | 7/1999 |
| EP | 1 149 934 A3 | 10/2001 |
| JP | 63209130 A  * | 8/1988 |

OTHER PUBLICATIONS

R. C. Budhani et al., Structural Order in Si–N and Si–N–O Films Prepared by Plasma Assisted Chemical Vapor Deposition Process, 5(4) J. Vac. Sci. Technol. A, 1644 (Jul./Aug. 1987).*

* cited by examiner

Primary Examiner—Minhloan Tran
Assistant Examiner—Thomas L. Dickey

(57) ABSTRACT

A low-thermal budget, silicon-rich silicon nitride film may include a concentration of hydrogen in Si—H bonds being at least 1.5 times as great as a concentration of hydrogen in N—H bonds. The silicon nitride film suppresses boron diffusion in boron-doped devices when such devices are processed using high-temperature processing operations that conventionally urge boron diffusion. The low-thermal budget, silicon-rich silicon nitride film may be used to form spacers in CMOS devices, it may be used as part of a dielectric stack to prevent shorting in tightly packed SRAM arrays, and it may be used in BiCMOS processing to form a base nitride layer and/or nitride spacers isolating the base from the emitter. Furthermore the low-thermal budget, silicon-rich silicon nitride film may remain covering the CMOS structure while bipolar devices are being formed, as it suppresses the boron diffusion that results in boron penetration and boron-doped poly depletion.

9 Claims, 9 Drawing Sheets

SILICON-RICH LOW THERMAL BUDGET SILICON NITRIDE FOR INTEGRATED CIRCUITS

FIELD OF THE INVENTION

The present invention relates most generally to semiconductor devices and methods for forming the same. More particularly, the present invention is related to a low thermal budget, silicon-rich SiN film used in various integrated circuit applications for suppressing boron penetration and boron depletion.

BACKGROUND OF THE INVENTION

Boron is a commonly favored P-type dopant in the semiconductor manufacturing industry and is commonly used in CMOS, BiPolar and BiCMOS technologies. Silicon nitride, films are used extensively in semiconductor manufacturing for various functions, various applications, and in various technologies. When SiN films are formed, using the various methods of formation, hydrogen is invariably incorporated into the film. For example, silane ($SiH_4$) is a source gas commonly used as the silicon source in the various processes used to form silicon nitride films. The hydrogen incorporated within the SiN film forms bonds with both the silicon (Si—H bonds) and the nitrogen (N—H bonds) components of the film. Si—H bonds include a higher activation energy than N—H bonds. As such, hydrogen that is bonded to nitrogen, as opposed to being bonded to silicon, is more susceptible to becoming dissociated from its bond and migrating throughout and from the SiN film. During various high-temperature processes, such un-bonded hydrogen urges boron diffusion when boron is used in the semiconductor device being formed. Such boron diffusion may result in boron penetration and boron-doped poly depletion. Because of the relative activation energies, it has been found that only the N—H bonded hydrogen contributes to the above-mentioned anomalies that negatively impact the device.

Processing operations carried out at elevated temperatures cause hydrogen to dissociate from N—H bonds. Boron is commonly used as the P-type dopant in polycrystalline silicon and other material. During high temperature operations, the presence of available, un-bonded hydrogen enhances the diffusion of boron from the P-doped polycrystalline silicon material. For example, in a CMOS transistor, in particular, a PMOS transistor, boron from the polycrystalline silicon, hereinafter "polysilicon", gate, may diffuse from the gate and into the gate oxide and/or the transistor channel. Such diffusion, a.k.a. boron penetration, is aided by the availability of free hydrogen such as hydrogen that was bound to nitrogen. In conventional silicon nitride films, hydrogen bound to the nitrogen is much more prevalent than hydrogen bound to silicon due, in part, to the conventional SiN film being substantially nitrogen-rich. In MOSFET technology, when conventional silicon nitride spacers are formed adjacent the poly gate, the hydrogen, prevalently bonded with nitrogen of the silicon nitride film and forming a weak bond therewith, breaks free and enhances boron diffusion during subsequent high-temperature processing operations such as the source/drain anneals typically carried out at temperatures within the range of 1000–1100° C. Such boron penetration into the transistor gate oxide or the transistor channel, shifts the $V_t$ (threshold voltage) of the transistor at the least, and may completely destroy transistor performance.

Another mechanism in which un-bonded hydrogen negatively impacts device performance is boron-doped poly depletion. Hydrogen that was formerly bound to nitrogen, becomes liberated and pairs with boron, an acceptor, to render the boron atom electrically inactive. According to this mechanism, the concentration of the P-type boron acceptor atoms is diminished in the polysilicon.

In the various technologies presently used in the semiconductor manufacturing industry, such as Embedded SRAMs, Enhanced SRAMs SiGe and other BiCMOS technologies, and advanced CMOS processes, silicon nitride material is commonly used for various applications such as spacers, salicide blocks and liners, and various insulators. Nitride films are also used as masking films to assist in the formation of other device features. Moreover, such technologies typically use boron-doped polysilicon materials for various structural and interconnect features. It would therefore be desirable to form silicon nitride materials in which the amount of hydrogen bound in Si—H bonds is increased, and the amount of hydrogen bound in N—H bonds, is decreased. It would likewise be desirable to form such a film using a low thermal budget. In this manner, the hydrogen remains bonded to the silicon nitride film and does not enhance the aforementioned mechanisms of boron penetration and boron-doped poly depletion that negatively impact semiconductor devices.

SUMMARY OF THE INVENTION

In one embodiment, the present invention provides a semiconductor MOS transistor comprising a gate structure that includes a polysilicon gate and silicon nitride spacers formed adjacent the gate structure. The silicon nitride spacers are formed of a SiN material characterized by having an Si—H concentration of silicon-hydrogen bonds being at least 1.5 times as great as an N—H concentration of nitrogen-hydrogen bonds.

In another embodiment, the present invention provides a bipolar transistor that includes a base and an emitter. An SiN material isolates the base from the emitter. The SiN material is characterized by having a Si—H concentration of silicon-hydrogen bonds being at least 1.5 times as great as an N—H concentration of nitrogen-hydrogen bonds therein.

In another exemplary embodiment, the present invention provides a method for fabricating semiconductor devices using BiCMOS processing technologies. The method includes providing at least one CMOS transistor on the first area of a substrate, forming a SiN film over the at least one transistor, the SiN film characterized by having a Si—H concentration of silicon-hydrogen bonds being at least 1.5 times as great as an N—H concentration of nitrogen-hydrogen bonds therein, and forming a bipolar transistor in a second region of the substrate.

According to yet another exemplary embodiment, the present invention provides a semiconductor product comprising CMOS transistors on a substrate and a dielectric film stack formed over the CMOS transistors and including a SiN film characterized by having a Si—H concentration of silicon-hydrogen bonds being at least 1.5 times as great as an N—H concentration of nitrogen-hydrogen bonds therein.

The foregoing is intended to be exemplary, and is not provided by way of limitation. The present invention is best understood by the foregoing general description and following detailed description and as recited in the appended claims.

BRIEF DESCRIPTION OF THE DRAWING

The present invention is best understood from the following detailed description when read in conjunction with the accompanying drawing. According to common practice, the various features of the drawing are not to scale and the dimensions of various features and relative dimensions and locations of features are arbitrarily expanded or reduced for clarity. Like numerals denote like features throughout the specification and drawing. Included in the drawing are the following figures, wherein.

DETAILED DESCRIPTION OF THE INVENTION

Figure 1:
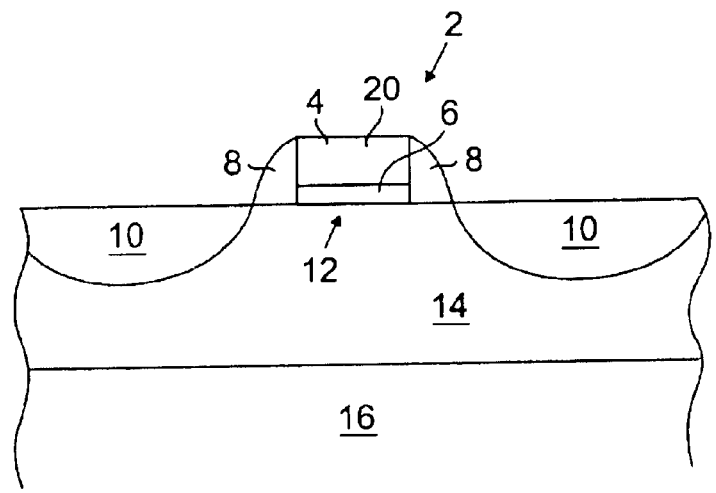
FIG. 1 is a cross-sectional view illustrating SiN spacers of the present invention.

The present invention provides a silicon-rich SiN (silicon nitride) film. The present invention further provides various methods for forming the silicon-rich SiN film using various processes that advantageously include a relatively low thermal budget. Due in large part to the methods and source gases used to form SiN films, such SiN films, including the SiN films of the present invention, include hydrogen interstitiated within the film and complexing with the components of the film, namely, silicon and nitrogen. According to preferred embodiments of the invention, silicon-rich SiN films include an increased amount of hydrogen bonded in Si—H bonds and a decreased amount of hydrogen bound in N—H bonds, compared to conventional SiN films. In one embodiment the SiN film induces a higher portion of the hydrogen being bound to silicon than to nitrogen. Since Si—H bonds include a higher activation energy than N—H bonds, a lesser amount of hydrogen is able to become dissociated and diffuse from the silicon nitride film to allow boron penetration and boron-doped poly depletion when subsequent high temperature processing operations are carried out.

The present invention provides the following film formation processes for forming a silicon-rich SiN film with an increased amount of hydrogen bonded to silicon in the SiN film: Rapid Thermal Chemical Vapor Deposition (RTCVD); Low Pressure Chemical Vapor Deposition (LPCVD) also referred to as furnace deposition; and, Plasma Enhanced Chemical Vapor Deposition (PECVD), also generally referred to as plasma deposition. The following film formation processes shown in Table 1, are intended to be exemplary and explanatory of the present invention, and not restrictive. In each case, the particular processing parameters may be changed depending on application. In particular, the relative amount of source gas flows may be varied to optimize the percentage of silicon in the silicon-rich SiN film formed, and the temperature may be varied to maintain the desired thermal budget.

TABLE 1

| Method | Temp | Pressure | Gas Flows |
|---|---|---|---|
| RTCVD | 650° C. | 275 Torr | 2400 cc $NH_3$ 2600 cc $N_2$ 50 cc $SiH_4$ |
| RTCVD | 750° C. | 275 Torr | 5000 cc $NH_3$ 50 cc $SiH_4$ |
| LPCVD | 800° C. | 100 mT | 3:1 $SiH_4Cl_2:NH_3$ |
| LPCVD | 725° C. | 100 mT | 3:1 $SiH_4Cl_2:NH_3$ |

The parameters above are intended to be exemplary of the various processes that may be used to form silicon-rich SiN films with relatively low thermal budgets. RTCVD processes find particular advantage because of their low thermal budgets. For comparison, an RTCVD process using a temperature of 750° C. for one minute may form a silicon nitride film typically formed in a furnace at a temperature of 800° C. for one hour. The aforementioned advantages of such a silicon-rich silicon nitride film with reduced N—H bond concentration (i.e. less boron diffusion) are achieved during various high-temperature processes carried out in the presence of boron, such as subsequent high temperature processing operations and the silicon-nitride film formation process itself. In many cases, boron may be present at the time the silicon nitride film is being formed and the reduced thermal budget of the SiN film formation process advantageously limits boron diffusion during such process. The various processing parameters of the processes of the present invention, may be varied and optimized such that the formed film is relatively silicon-rich and a majority of hydrogen is bonded to silicon as opposed to nitrogen. The bulk concentration of Si—H and N—H bonds in the film may generally be on the order of $1e^{21}/cm^3$ to $1e^{22}/cm^3$ in one exemplary embodiment. In another exemplary embodiment, the concentration of Si—H bonds may be within the range of $1e^{20}$–$5e^{20}/cm^3$ with the concentration of N—H bonds within the range of $5e^{19}$–$8e^{19}/cm^3$. According to another exemplary embodiment, the relative amounts of Si—H bonds and N—H bonds may be substantially the same. In one exemplary embodiment, the SiN film may be characterized by having a Si—H concentration of silicon-hydrogen bonds being at least 1.5 times as great as a N—H concentration of nitrogen-hydrogen bonds. In another exemplary embodiment, the film may be formed to include a Si—H concentration of silicon-hydrogen bonds being 5–10 times as great as a N—H concentration of nitrogen-hydrogen bonds.

The low thermal budget, silicon-rich SiN film of the present invention finds application in the various technologies used in semiconductor manufacturing. Exemplary applications for the silicon-rich SiN film of the present invention include MOS transistor spacers, emitter-base spacers for bipolar transistors, the base nitride film used in BiCMOS processing, and as a part of a composite film stack used in highly integrated technologies with reduced feature sizes and aggressive design rules, such as ESRAM (enhanced/embedded SRAM) technologies. The silicon-rich silicon nitride film of the present invention may be used in various other applications such as a masking film used to form various features in integrated circuit devices. The silicon-rich silicon nitride film of the present invention also finds advantage used as a blanket film formed throughout the device and that is subsequently subjected to high temperature processing operations. Regardless of the function (permanent, masking film) of the silicon nitride film, the reduced ratio of N—H bonds: Si—H bonds is believed to reduce boron penetration, boron-doped poly depletion and other such undesirable device effects.

In one exemplary embodiment, the low thermal budget, silicon-rich silicon nitride film of the present invention is used to form spacers for MOSFET transistors. An exemplary semiconductor MOS transistor is shown in FIG. 1. CMOS transistor 2 includes gate 4, gate dielectric 6 and channel 12. CMOS transistor 2 may be a PMOS transistor including gate 4. In an exemplary embodiment, gate 4 may be doped with a p-type dopant. CMOS transistor 2 may be considered a PMOS transistor including p-channel 12, and as such, tub area 14 may be an n-doped tub formed in substrate 16. Gate 4 may be a "p+" gate formed of polysilicon doped with boron. By "p+", it is meant that a relatively high p-type dopant concentration is used. In one exemplary embodiment, the doping concentration may be $1e^{19}$ atoms/cm$^3$ or greater. Other semiconductor gate materials and dopant concentrations may be used in other exemplary embodiments.

Spacers 8 are formed adjacent gate structure 20 which consists of gate 4 and gate oxide 6. An advantageous application of the low thermal budget, silicon-rich, silicon nitride film of the present invention is that, when used as spacers 8, less boron diffusion occurs. Spacers 8 aid in the location of source/drain regions 10. Spacers 8 may be formed using conventional deposition/etch-back methods. Source/drain regions 10 may be formed by an implantation process and spacers 8 prevent source/drain regions 10 from extending under gate 20. After source/drain regions 10 are formed, they are annealed at high temperatures, typically in the range of 1000° C.–1100° C. During such a high-temperature operation, boron present in the vicinity, such as in gate 4, may diffuse such that boron penetrates gate oxide 6 and channel 12, adversely affecting device performance or destroying the device. The presence of boron in gate oxide 6, reduces the threshold voltage $V_t$, of CMOS (PMOS) transistor 2. In an exemplary embodiment in which PMOS transistor 2 is formed to include a desired 250 millivolt $V_t$, it was found that while transistors formed using conventional nitride films as spacers had an actual $V_t$ of 221 millivolts due to boron diffusion, an exemplary PMOS transistor 2 formed using spacers formed of the low-thermal budget, silicon-rich silicon nitride of the present invention, had a $V_t$ of 247 millivolts. Such a reduction in $V_t$ shift is intended to be exemplary only, and to illustrate the finding that there is a reduction in $V_t$ shift that correlates to a reduction in the concentration of N—H bonds in the silicon nitride film used as spacers 8. In the present invention, the reduction of $V_t$ shift is attributable to the silicon-rich, silicon nitride film of the present invention, which may achieve other reductions in $V_t$ shifts according to various other exemplary PMOS transistors.

Figure 2:
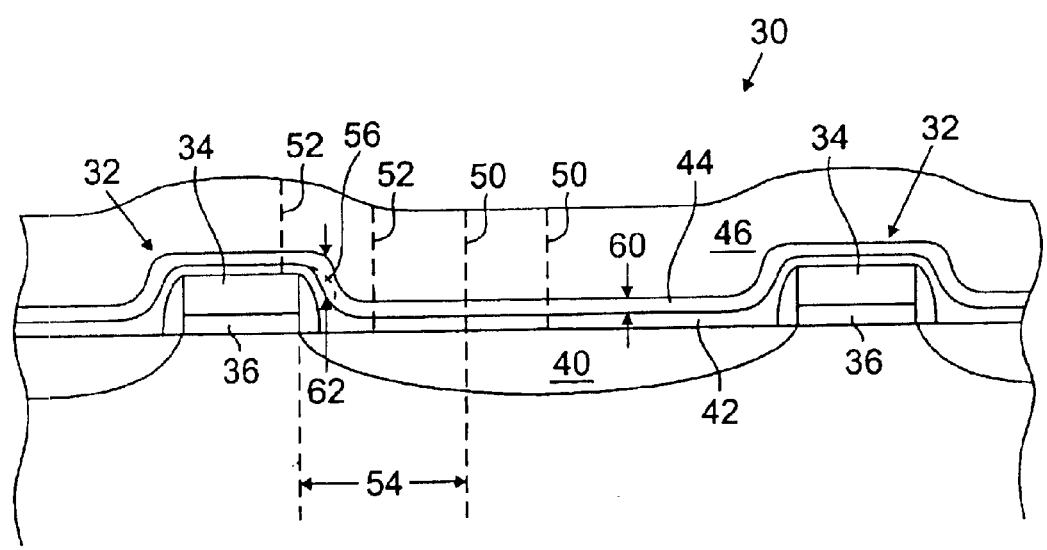
FIG. 2 is a cross-sectional view showing an SiN film of the present invention formed within an SRAM cell.

The low thermal budget, silicon-rich silicon-nitride film of the present invention also finds application in SRAM cells such as enhanced SRAMs or embedded SRAMs, that are manufactured to include a reduced transistor-to-transistor spacing. Because of tighter transistor-to-transistor spacing as a result of aggressive design rules, silicon nitride films are frequently used in SRAM cells such as illustrated in FIG. 2. Similar to the CMOS transistor embodiment, the silicon nitride film lies in close proximity to the transistor gates which may include boron as a p-type dopant, and in close proximity to gate oxides and channels, and therefore provides the same advantageous $V_t$ stability as discussed in conjunction with the CMOS transistor in FIG. 1.

Referring to FIG. 2, SRAM cell 30 includes transistors 32, each including gates 34 and gate dielectrics 36. Transistors 32 formed in close proximity may share a common source/drain 40 and may be separated by a spacing of 0.2 microns or less in various exemplary embodiments. Silicon nitride films are advantageously used as part of a dielectric stack such as films 42, 44 and 46, to prevent shorting due to misalignment, made more possible due to the tight design rules which allow contacts such as contact 50 to be formed in close proximity 54 to transistor 32. In an exemplary embodiment, the SRAM design rules allow a spacing between transistor 32 and a proximate opening, such as opening 50, of 80 nanometers. It can be therefore understood that slight misalignment may result in the location of an opening such as opening 52.

The dielectric film stack may include lower film 42, a TEOS oxide film having a thickness of 100 angstroms, a silicon nitride film 44 having a thickness ranging from 200–1000 angstroms, and an upper, deposited oxide film 46 having a thickness on the order of about 10,000 angstroms. This film stack is exemplary only and other stacks including other thicknesses may be used. Silicon nitride film 44 is favored because, where it extends over the steps of the transistor, it includes a portion 56 that has a vertical thickness 62 greater than the bulk thickness 60 of the film. In this manner, if a contact, such as contact 52, is misaligned and extends at least partially over transistor 32, the three-step etch process (oxide etch/nitride etch/TEOS oxide etch) would not produce the removal of all of the dielectric films which would cause a conductive material filled in exemplary misaligned opening 52, to undesirably short source/drain region 40 to gate 34. Portion 56 would not completely be removed, nor would the underlying portion of lower film 42, due to increased vertical thickness 62. As such, silicon nitride film 44 is particularly useful in this application within tightly packed SRAM cells and provides the advantage of reduced boron-doped poly depletion and reduced boron penetration and a corresponding reduction of $V_t$ shift, in the transistors. Silicon nitride film 44 is advantageously the silicon-rich, low thermal budget silicon nitride film of the present invention, as described above.

Preferably, the silicon nitride film 44 is formed using a low thermal budget process, such as an RTCVD process at 650° C. at a deposition time of 1–2 minutes, and a suitable source/gas ratio to produce the silicon-rich, silicon nitride film as discussed above and ensure a favorably low-N—H:Si—H ratio. Additional processing operations at elevated temperatures above 600° C. may be subsequently used in the formation of SRAM cell 30, and during such high-temperature operations, undesirable boron diffusion is suppressed.

The silicon-rich silicon nitride film of the present invention also finds application in a BiCMOS process flow which uses multiple layers of such a silicon nitride film. The first silicon nitride layer is commonly used as part of the dielectric between the emitter and base poly layers in the bipolar transistor. The second and third nitride layers may be deposited and etched to form spacers inside the emitter window of the bipolar transistor. A low content of available hydrogen is particularly advantageous in the first nitride layer since it remains on top of the CMOS area during a significant portion of the bipolar process. Otherwise, the thermal cycling during the bipolar process may cause excessive hydrogen in the nitride film to become dissociated in the vicinity of the CMOS gate poly for PMOS transistors formed in the CMOS area of the BiCMOS structure. The boron used to dope the gate in the p+ gate poly of the PMOS transistor would then diffuse through the gate oxide (boron penetration, as above). The amount of this diffusion will vary with the presence of available hydrogen in the region of the gate poly. Boron penetration is observed in conventional PMOS devices if the nitride layer covering the CMOS region contains too much available hydrogen, that is, an abundance of N—H bonds compared to Si—H bonds. Boron penetration into the transistor gate negatively affects the electrical performance of the PMOS transistor. As discussed above, the undesirable $V_t$ shift of the transistor correlates to the amount of unbonded or weakly bonded hydrogen, that is, N—H bonds, in the silicon nitride film.

FIGS. 3A–3H are cross-sectional views showing an exemplary BiCMOS process sequence. The BiCMOS process sequence illustrates how the low thermal budget, silicon-rich silicon nitride film of the present invention finds application as spacers that isolate the bipolar transistor base from the emitter; as a base nitride film—a blanket film that further insulates the bipolar transistor base from the emitter; and, shows that the low thermal budget, silicon-rich, silicon nitride film of the present invention remains over the CMOS transistors during the formation of the bipolar transistor, such formation including high temperature processes during which the silicon nitride film of the present invention suppresses boron penetration from the CMOS transistor gates into the CMOS transistor dielectric and channels.

Figure 3A:
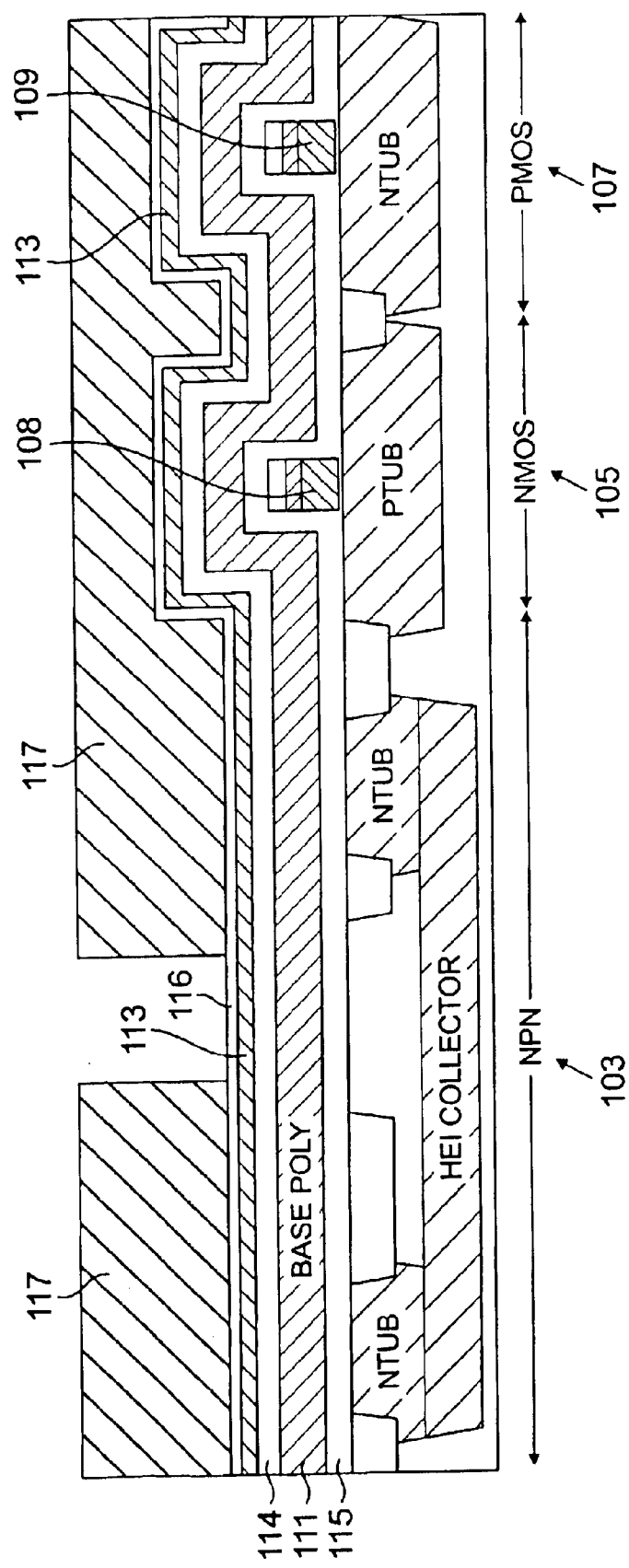
FIGS. 3A–3H are cross-sectional views illustrating an exemplary BiCMOS process sequence utilizing the SiN film of the present invention.

FIG. 3A illustrates an exemplary cross-section of a BiCMOS process flow at a stage after which NMOS transistor 108 and PMOS transistor 109 have been formed within NMOS region 105 and PMOS region 107, respectively. PMOS transistor 109 includes a gate structure advantageously formed of p+ polysilicon doped with boron but other gate materials may be used in other exemplary embodiments. At this stage of the processing, the bipolar transistor has not yet been formed in NPN region 103. After an exemplary deposited oxide 115 is formed over the CMOS transistors and within NPN region 103, a base polysilicon film 111 is formed and a p-type dopant impurity such as boron introduced in the film. Base silicon nitride film 113 is formed over the structure, and may be formed with an additional deposited oxides 114 and 116. Base silicon nitride film 113 is the aforedescribed low thermal budget, silicon-rich silicon nitride film, and it can be seen that such film extends over base polysilicon film 111 within NPN region 103, and over NMOS and PMOS regions 105 and 107, respectively. Photosensitive film 117 is then formed and patterned to begin the production of the bipolar transistor.

Figure 3B:
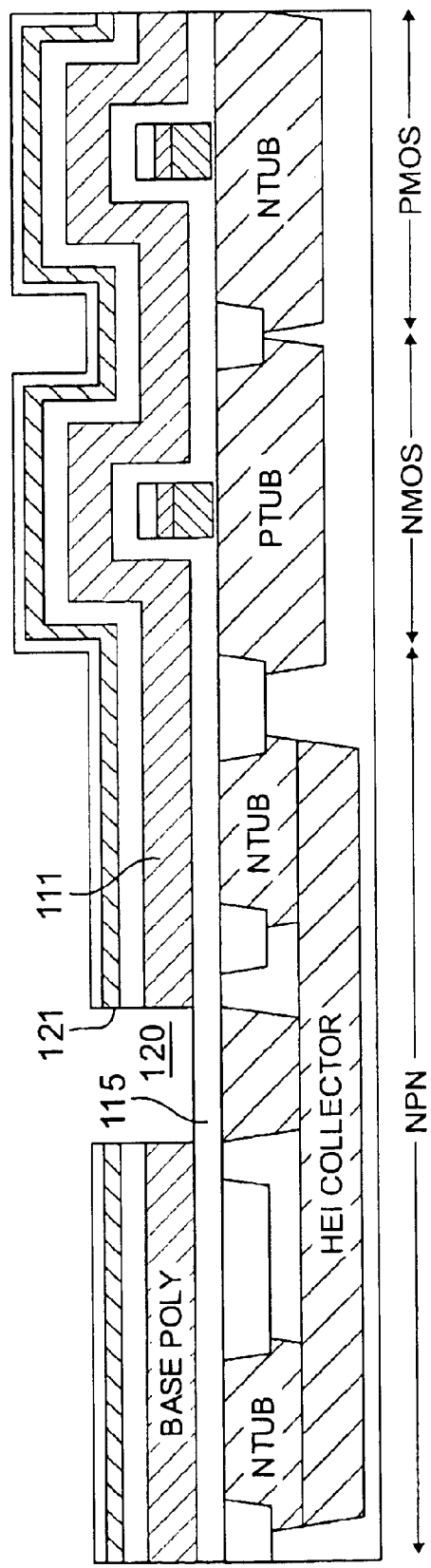
Figure 3C:
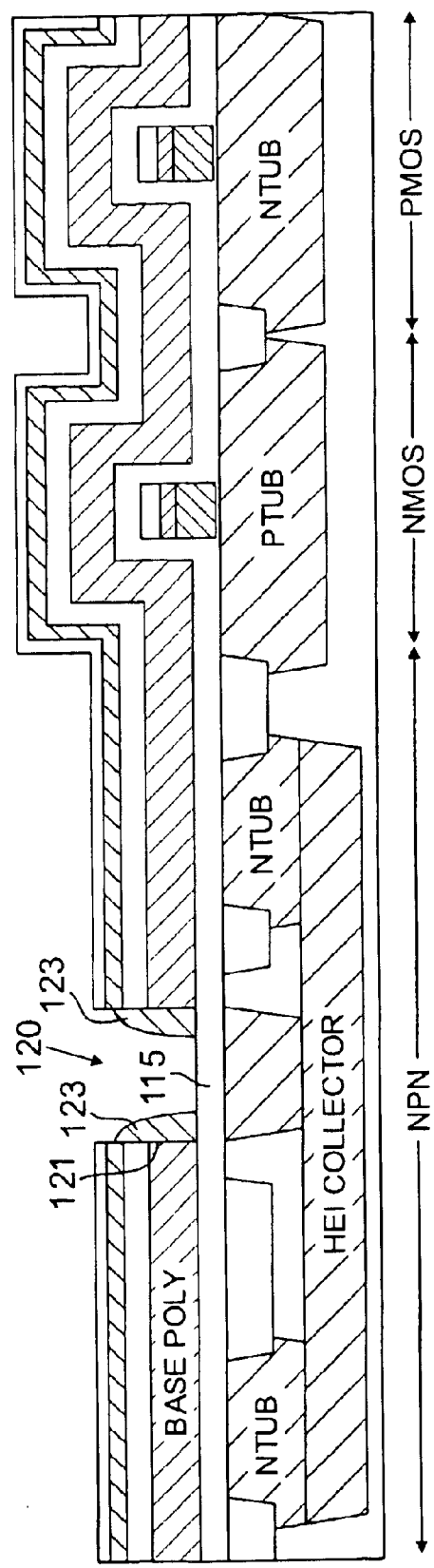
Figure 3D:
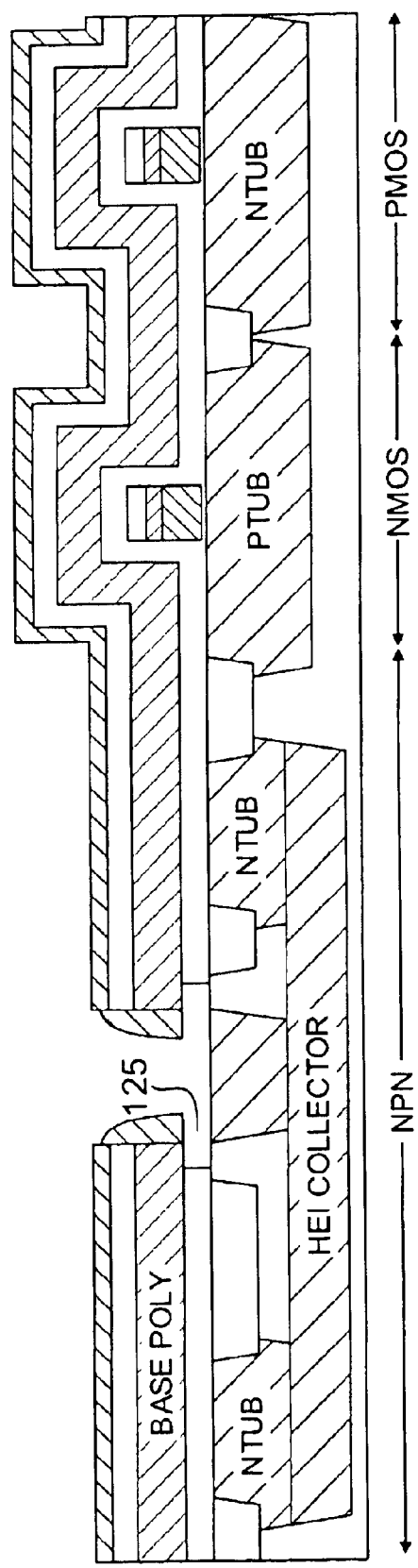
Figure 3E:
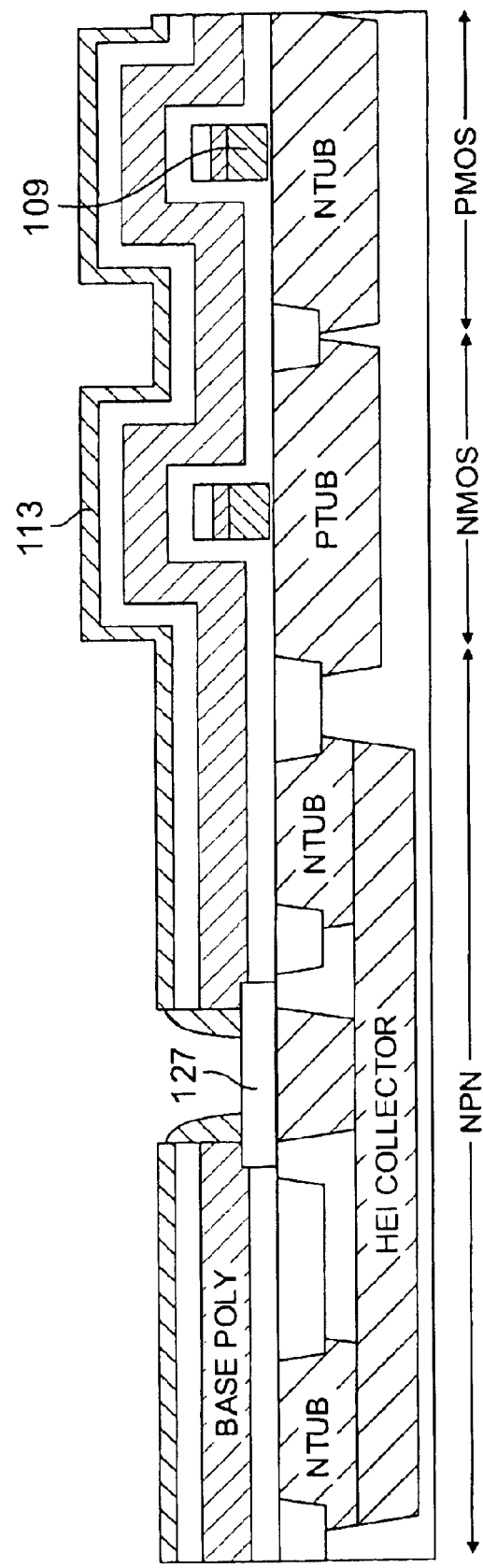

Now turning to FIG. 3B, an etch process is carried out to expose deposited oxide layer 115 and form opening 120, which includes sidewalls 121 and extends through base polysilicon film 111. FIG. 3C shows silicon nitride spacers 123 formed along sidewalls 121 within opening 120. Silicon nitride spacers 123 may be the low thermal budget, silicon-rich silicon nitride film according to the present invention and may be formed using conventional techniques. FIG. 3D shows opening 125 formed to extend beneath the base polysilicon film 111. Base silicon nitride film 113 further serves as a masking film in the exemplary processing operation shown in FIG. 3D which may include a selective etching process. A selective epitaxial growth process is then used to form SiGe base 127 as shown in FIG. 3E. This growth process may take place at an elevated temperature such as within the range of 700–900° C. In one exemplary embodiment, the SiGe epitaxial base formation process may take place at 800° C. for about 20 minutes. During this high temperature operation, the reduced amount of N—H bonded hydrogen in base silicon nitride film 113 suppresses boron penetration and $V_t$ shift within PMOS transistor 109 during this exemplary processing operation at elevated temperatures.

Figure 3F:
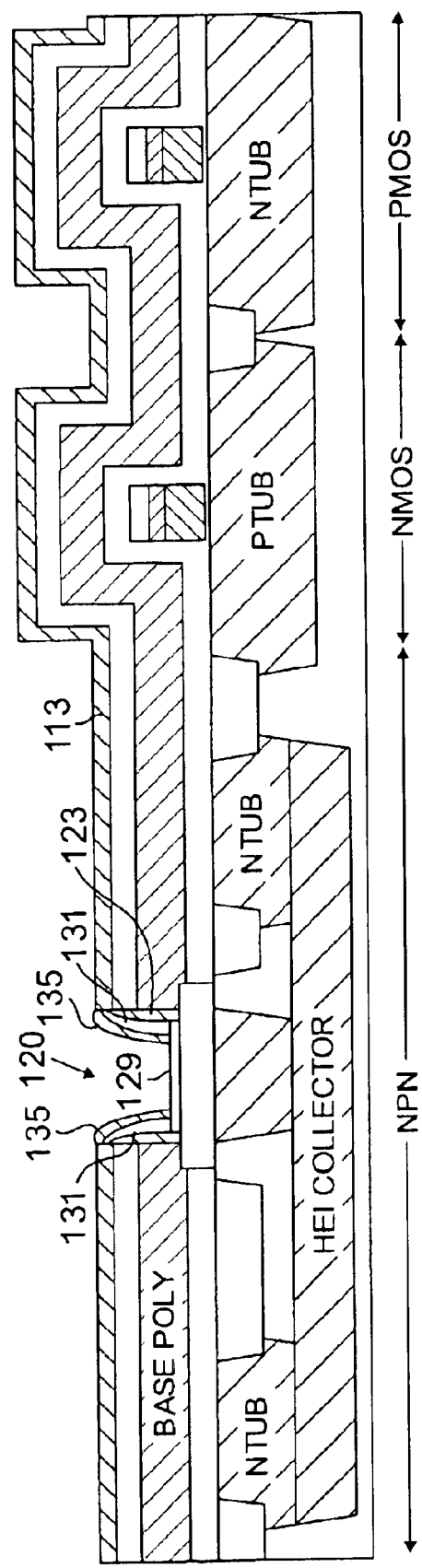
Figure 3G:
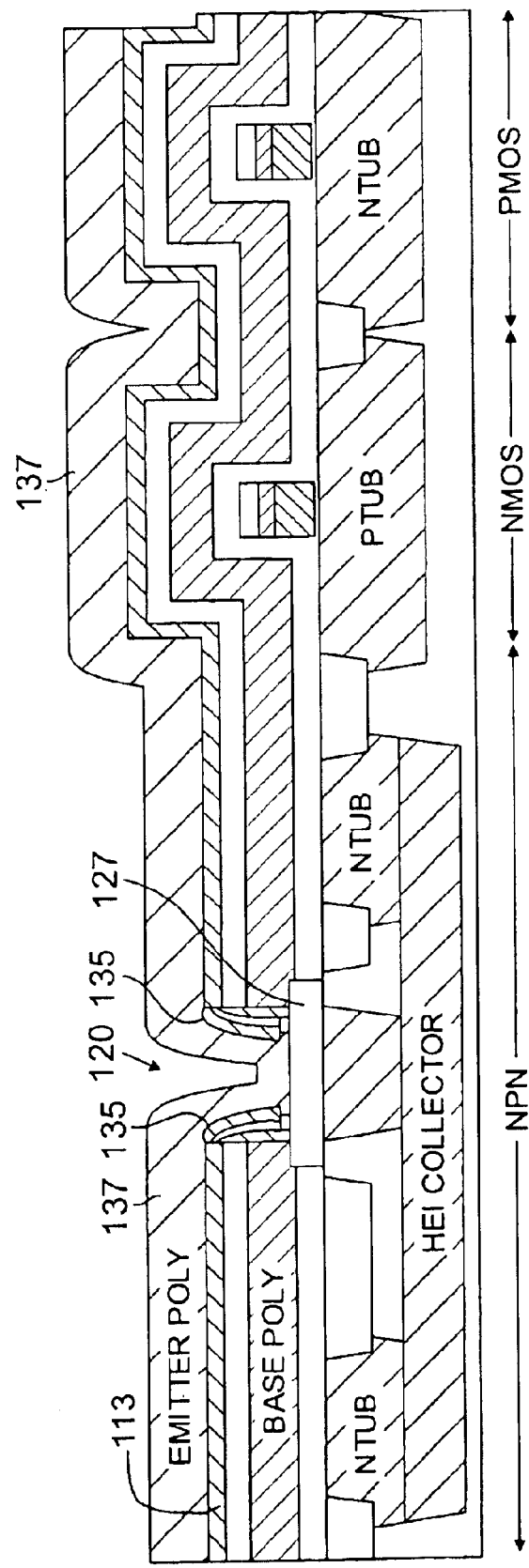
Figure 3H:
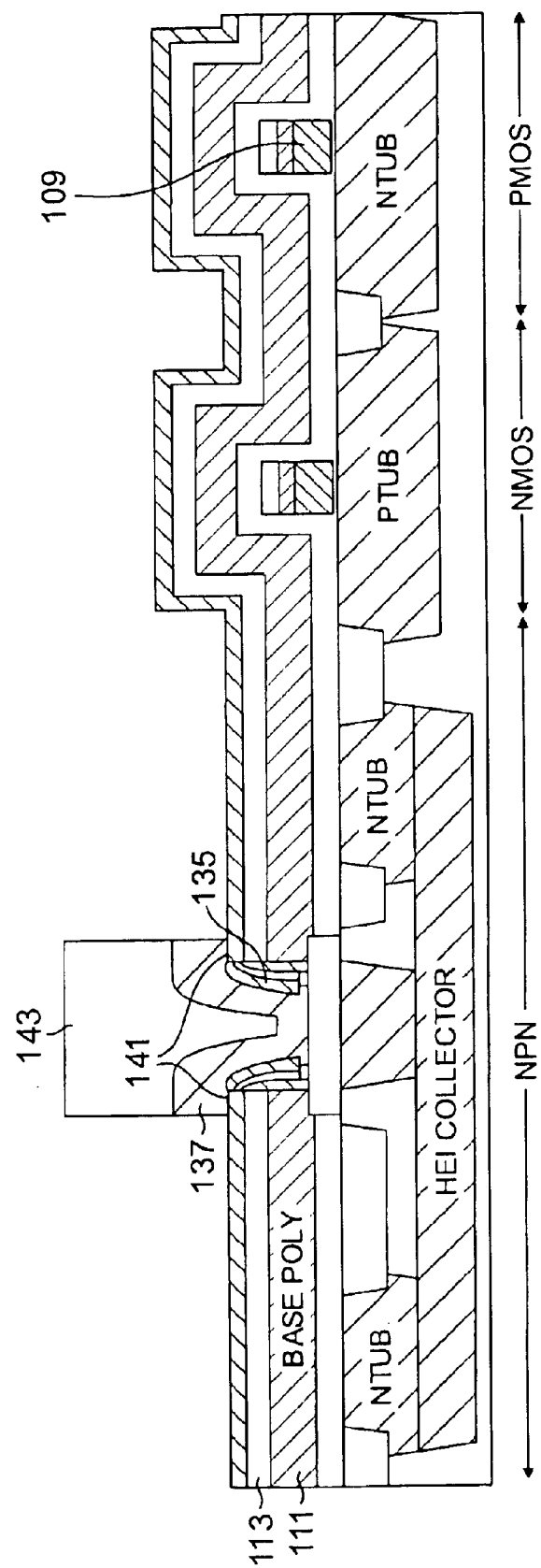

FIG. 3F shows second silicon nitride spacers 135 also formed within opening 120 and generally along sidewalls 121. Interposed between each silicon nitride spacer 123 and second silicon nitride spacer 135, is spacer oxide film 131 which includes a planar section 129. It should be pointed out that each of silicon nitride spacer 123 and second silicon nitride spacer 135 may be considered a plurality of spacers formed along sidewalls 121, or, in the case in which opening 120 is a circular opening and sidewalls 121 extend completely around the opening, each of silicon nitride spacer 123 and second silicon nitride spacer 135 may be considered a single spacer. Conventional techniques for forming spacers may be used in each case. FIG. 3G shows an emitter polysilicon film 137 formed over base silicon nitride film 113 (FIG. 3F) and within opening 120. FIG. 3H shows the structure after a photolithographic process has been carried out to pattern emitter polysilicon film 137. Standard photolithographic processes, including optional hard mask 143, may be used. FIG. 3H shows that emitter polysilicon 137 is isolated from base polysilicon film 111 by means of the heretofore described silicon nitride spacers 123 and 135. Emitter polysilicon film 137 also includes overhang portions 141 that are insulated from base polysilicon film 111 by the base silicon nitride film 113 of the present invention.

In summary, base silicon nitride film 113 includes the reduced concentration of N—H bonds according to the present invention and suppresses boron diffusion in the CMOS area, particularly in PMOS transistor 109. In an exemplary embodiment, base silicon nitride film 113 is formed using a low thermal budget, such as, for example, an RTCVD process at 750° C. for one minute compared to a typical furnace nitride of 800° C. for one hour, and an advantage is achieved because boron diffusion is suppressed during this low-thermal budget film formation operation. When the films used to form silicon nitride spacers 123 and second silicon nitride spacers 135 are also formed using a similar low thermal budget process, boron diffusion is further suppressed. In the bipolar transistor, the combination of the low thermal budget formation and the reduced N—H bond concentration suppresses boron diffusion from base polysilicon 111 and reduces the problems associated therewith, such as boron-doped poly depletion.

The exemplary SiGe epitaxial formation process at high temperature is intended to be exemplary of the subsequent processing operations used to form the bipolar transistor after the boron-doped PMOS gate and base polysilicon film 111 have been formed and doped with boron. Various other process operations at elevated temperatures above 600° C. may be used during the formation of the bipolar transistor, according to various exemplary embodiments.

The particular structures and apparent relative dimensions and locations of the features, the materials used for the device features and the sequence of processing operations, illustrated in FIGS. 3A–3H, are intended to be exemplary only and various other arrangements may be used in other exemplary BiCMOS embodiments in which the silicon-rich low thermal budget SiN film of the present invention is utilized in a BiCMOS processing sequence.

Although generally described with respect to boron penetration which results at high temperatures and is limited by the low-thermal budget, silicon-rich silicon nitride film of the present invention, it should be understood that the preferential bonding of hydrogen to silicon and the lower thermal budget in film formation also reduces boron-doped depletion, which phenomenon undesirably lowers the effective doping concentration of the boron in a semiconductor film such as polysilicon.

The preceding merely illustrates the principles of the invention. It will thus be appreciated that those skilled in the art will be able to devise various arrangements which, although not explicitly described or shown herein, embody the principles of the invention and are included within its scope and spirit. All examples and conditional language recited herein are exemplary to aid in understanding the principles of the invention, and are to be construed as being without limitation to the scope of the invention. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is only to be limited by the appended claims.

What is claimed is:

1. A semiconductor product comprising at least one semiconductor MOS transistor having a gate structure including a polysilicon gate and at least one silicon nitride spacer formed adjacent said gate structure, said silicon nitride spacer formed of SiN material characterized by having a Si—H concentration of silicon-hydrogen bonds being at least 1.5 times as great as a N—H concentration of nitrogen-hydrogen bonds, said polysilicon gate including boron as a dopant impurity.

2. The semiconductor product as in claim 1, in which said polysilicon gate includes a boron dopant impurity concentration being at least $1e^{19}$ atoms/cm$^3$.

3. The semiconductor product as in claim 1, in which said Si—H concentration lies within the range of $1e^{20}$–$5e^{20}$ atoms/cm$^3$ and said N—H concentration lies within the range of $5e^{19}$–$8e^{19}$ atoms/cm$^3$.

4. A transistor comprising a boron doped active region and an SiN spacer isolating said boron doped active region from other regions of the transistor, said SiN spacer characterized by having a Si—H concentration of silicon-hydrogen bonds being at least 1.5 times as great as a N—H concentration of nitrogen-hydrogen bonds therein.

5. The semiconductor product as in claim 4, in which said transistor comprising a bipolar transistor having a base an an emitter and wherein said base is formed of a boron-doped polysilicon section and an SiGe section, and said emitter is formed of polysilicon material.

6. The semiconductor product as in claim 4, in which said boron doped region comprises a base of a bipolar transistor, said base including a boron-doped polysilicon film having an opening therein, said opening including sidewalls, said at least one silicon nitride spacer formed along said sidewalls, and said transistor having an emitter formed of a semiconductor material extending within said opening and isolated from said base by at least said at least one silicon nitride spacer.

7. The semiconductor product as in claim 4, in which said transistor is a bipolar transistor having a base and an emitter and wherein said emitter is formed of a polysilicon material including a section overlapping said base, said base formed of boron-doped polysilicon, and said SiN material comprises a silicon nitride film vertically interposed between said section of said emitter and said base.

8. The semiconductor product as in claim 4, in which said SiN material includes said Si—H concentration within the range of $1e^{20}$–$5e^{20}$ atoms/cm$^3$ and said N—H concentration within the range of $5e^{19}$–$8e^{19}$ atom/cm$^3$.

9. The semiconductor product as in claim 4, in which said bipolar transistor is formed on a substrate as part of an integrated circuit and further comprising at least one MOS transistor formed on said substrate in said integrated circuit, said SiN material forming a film that extends over said at least one MOS transistor.

* * * * *